United States Patent
Amano et al.

(10) Patent No.: US 11,335,871 B2
(45) Date of Patent: May 17, 2022

(54) PHOTOELECTRIC CONVERSION DEVICE AND MANUFACTURING METHOD THEREOF

(71) Applicant: KABUSHIKI KAISHA TOSHIBA, Minato-ku (JP)

(72) Inventors: Akio Amano, Machida (JP); Hideyuki Nakao, Setagaya (JP); Kenji Todori, Yokohama (JP); Kenji Fujinaga, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/811,761

(22) Filed: Mar. 6, 2020

(65) Prior Publication Data
US 2020/0212330 A1 Jul. 2, 2020

Related U.S. Application Data

(63) Continuation of application No. PCT/JP2018/034481, filed on Sep. 18, 2018.

(51) Int. Cl.
*H01L 31/00* (2006.01)
*H01L 51/44* (2006.01)
(Continued)

(52) U.S. Cl.
CPC ......... *H01L 51/442* (2013.01); *H01G 9/2022* (2013.01); *H01L 51/0014* (2013.01);
(Continued)

(58) Field of Classification Search
CPC ............. H01L 2251/10; H01L 51/0014; H01L 51/0023
See application file for complete search history.

(56) References Cited

U.S. PATENT DOCUMENTS

2008/0108171 A1   5/2008  Rogers et al.
2012/0204931 A1   8/2012  Seike
(Continued)

FOREIGN PATENT DOCUMENTS

CN   106663703 A   5/2017
EP   3 146 573     3/2017
(Continued)

OTHER PUBLICATIONS

International Search Report dated Oct. 23, 2016 in PCT/JP2018/034481 filed Sep. 18, 2018 (with English Translation of Categories of Cited Documents) citing documents AI-AK; AT-AV & BO-BU therein, 5 pages.

*Primary Examiner* — Angelo Trivisonno
(74) *Attorney, Agent, or Firm* — Oblon, McClelland, Maier & Neustadt, L.L.P.

(57) ABSTRACT

A photoelectric conversion device in an embodiment includes a first photoelectric conversion part including a first transparent electrode, a first photoelectric conversion layer, and a first counter electrode and a second photoelectric conversion part including a second transparent electrode, a second photoelectric conversion layer, and a second counter electrode, the first photoelectric conversion part and the second photoelectric conversion part being provided on a transparent substrate. The first counter electrode and the second transparent electrode are electrically connected by a connection part. As for the first photoelectric conversion layer and the second photoelectric conversion layer, adjacent portions of the adjacent first and second photoelectric conversion layers are electrically separated by an inactive region having electrical resistance higher than that of the first and second photoelectric conversion layers.

5 Claims, 4 Drawing Sheets

(51) Int. Cl.
  *H01G 9/20* (2006.01)
  *H01L 51/00* (2006.01)
(52) U.S. Cl.
  CPC ...... *H01L 51/0023* (2013.01); *H01L 51/0029* (2013.01); *H01L 2251/10* (2013.01); *H01L 2251/308* (2013.01)

(56) References Cited

U.S. PATENT DOCUMENTS

| | | |
|---|---|---|
| 2016/0254472 A1 | 9/2016 | Wang et al. |
| 2016/0276611 A1 | 9/2016 | Oooka et al. |
| 2017/0125712 A1 | 5/2017 | Reid et al. |
| 2017/0170418 A1 | 6/2017 | Winkel et al. |
| 2017/0194102 A1* | 7/2017 | Huang ............ H01L 25/047 |
| 2018/0062099 A1 | 3/2018 | Oooka et al. |
| 2018/0090711 A1 | 3/2018 | Gotanda et al. |
| 2018/0114874 A1 | 4/2018 | Aranami |
| 2018/0211792 A1 | 7/2018 | Mori et al. |
| 2019/0088417 A1 | 3/2019 | Mori et al. |

FOREIGN PATENT DOCUMENTS

| | | |
|---|---|---|
| EP | 3 195 371 | 7/2017 |
| JP | 62-242371 A | 10/1987 |
| JP | 2006-222384 A | 8/2006 |
| JP | 2010-103170 A | 5/2010 |
| JP | 2013-247372 A | 12/2013 |
| JP | 5715795 B2 | 5/2015 |
| JP | 2016-178172 A | 10/2016 |
| JP | 6030176 B2 | 11/2016 |
| JP | 2017-69533 A | 4/2017 |
| JP | 2017-521870 A | 8/2017 |
| JP | 2018-49970 A | 3/2018 |
| JP | 2018-120992 A | 8/2018 |
| JP | 2019-54142 A | 4/2019 |
| TW | 201724542 A | 7/2017 |
| WO | 2015/092433 A1 | 6/2015 |
| WO | WO 2015/177521 A1 | 11/2015 |
| WO | WO 2016/012802 A1 | 1/2016 |

* cited by examiner

PHOTOELECTRIC CONVERSION DEVICE AND MANUFACTURING METHOD THEREOF

CROSS-REFERENCE TO RELATED APPLICATIONS

This application is based upon and claims the benefit of priority from International Patent Application No. PCT/JP2018/034481, filed on Sep. 18, 2018; the entire contents of which are incorporated herein by reference.

FIELD

Embodiments described herein generally relate to a photoelectric conversion device and a manufacturing method thereof.

BACKGROUND

Organic/inorganic hybrid semiconductors are expected to be applied to photoelectric conversion devices such as a solar cell, a light emitting device, and a photosensor. As the organic/inorganic hybrid semiconductor, for example, a perovskite compound has been known. Using the organic/inorganic hybrid semiconductor as a forming material or the like of active layers of photoelectric conversion devices such as a solar cell makes it possible to employ an inexpensive coating method for forming a photoelectric conversion layer (the active layer) and the like, and thus enables a great reduction in a formation cost of the active layers and the like. Because of this, an organic/inorganic hybrid solar cell is expected as next-generation solar cells that cost low.

Cells forming a solar cell module each have a structure in which an active layer is sandwiched by a transparent electrode and a counter electrode. For the transparent electrode, a conductive metal oxide such as indium tin oxide (ITO) that is not sufficient for conductivity generally, a conductive polymer, a carbon material, or the like, a composite material in which an additive such as a metal nanowire is compounded with any of these, or the like is used, so that efficiency for extracting generated electric charges to the outside deteriorates as a cell area is increased. Therefore, a plurality of strip-shaped cells are formed side by side and the plural cells are connected in series. A solar cell module having the plural cells is formed by the following method, for example.

First, transparent electrodes of the respective cells are formed on a transparent substrate. An active layer is formed on the whole surface of the plural transparent electrodes by coating. Parts of the active layer are scribed, and thereby grooves from which the transparent electrodes are exposed are formed. Counter electrodes are formed on the active layer having the scribe grooves so as to correspond to the respective cells. At this time, in the scribe groove, the counter electrode of the adjacent cell is filled, so that the counter electrode of the adjacent cell is electrically connected to the transparent electrode exposed to the inside of the scribe groove. The counter electrodes are formed in a state of being electrically separated for cells by using, for example, mask evaporation, or after being formed uniformly, for example, the counter electrodes are electrically separated for cells by scribing.

The scribing of the active layer is performed for forming a groove to be a region where a connection part that electrically connects the counter electrode and the transparent electrode of the two adjacent cells is formed and for dividing the active layer uniformly formed on a plurality of the transparent electrodes according to a plurality of the cells. The scribing is executed by mechanical scribing using a cutting tool, for example. In the case where metal is used as the counter electrode and a conductive metal oxide is used as the transparent electrode when scribing the active layer and the counter electrode, a stack of materials different in hardness including the soft and viscous active layer disposed between these is scribed, and therefore there is a problem that when the pressure in scribing is weak, the active layer is likely to remain in the groove or on the conductive metal oxide.

When the active layer remains in the groove or on the conductive metal oxide, an electrical short occurs between adjacent portions (proximity portions) of the adjacent active layers, resulting in that characteristics such as photoelectric conversion efficiency may deteriorate. In the meantime, increasing the pressure, output, or the like at the time of the scribing so as to prevent the active layer from remaining is likely to cause a crack or the like in a conductive oxide layer. Further, in the case where a conductive polymer having the same softness as that of the active layer is used as the transparent electrode, it is difficult to selectively scribe and remove only the active layer so that the conductive polymer remains. Therefore, there is demanded a separation structure that enables an increase in electrical separability between the adjacent portions (proximity portions) of the active layers of the adjacent cells.

DETAILED DESCRIPTION

Figure 1:
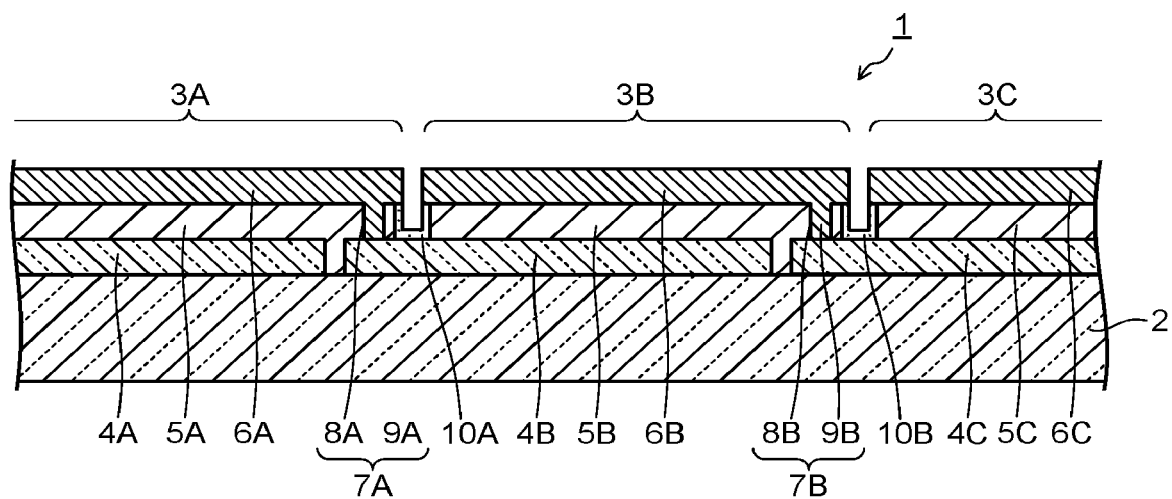
FIG. 1 is a cross-sectional view illustrating a schematic structure of a photoelectric conversion device according to an embodiment.

A photoelectric conversion device in an embodiment includes: a transparent substrate; a first photoelectric conversion part including a first transparent electrode provided on the transparent substrate, a first photoelectric conversion layer disposed on the first transparent electrode and containing a perovskite compound, and a first counter electrode disposed on the first photoelectric conversion layer; a second photoelectric conversion part including a second transparent electrode provided on the transparent substrate adjacently to the first transparent electrode and separated from the first transparent electrode, a second photoelectric conversion layer disposed on the second transparent electrode adjacently to the first photoelectric conversion layer and containing a perovskite compound, and a second counter electrode disposed on the second photoelectric conversion layer; a connection part electrically connecting the first counter electrode and the second transparent electrode; and an inactive region provided between the first photoelectric conversion layer and the second photoelectric conversion layer to electrically separate adjacent portions of the first photoelectric conversion layer and the second photoelectric conversion layer, and the inactive region having electrical resistance higher than electrical resistance of the first and second photoelectric conversion layers.

Hereinafter, a photoelectric conversion device in an embodiment and a manufacturing method thereof will be explained with reference to the drawings. Note that, in each embodiment, substantially the same constituent parts are denoted by the same reference numerals and symbols and their explanations will be partly omitted in some cases. The drawings are schematic, and a relation of thickness and planar dimension, a thickness ratio among parts, and so on are sometimes different from actual ones. Terms indicating up and down directions and so on in the explanation indicate relative directions when a surface, of a later-described transparent substrate, where to form photoelectric conversion parts is defined as an up direction, unless otherwise noted, and they are sometimes different from actual directions based on a gravitational acceleration direction.

FIG. 1 illustrates a schematic structure of a photoelectric conversion device in the embodiment. A photoelectric conversion device 1 illustrated in FIG. 1 includes a transparent substrate 2 functioning as a support substrate and a plurality of photoelectric conversion parts 3 (3A, 3B, 3C) provided on the transparent substrate 2. The photoelectric conversion parts 3 each include a transparent electrode 4 (4A, 4B, 4C), a photoelectric conversion layer 5 (5A, 5B, 5C), and a counter electrode 6 (6A, 6B, 6C) that are formed on the transparent substrate 2 in order.

The transparent substrate 2 is formed of a material having a light transmitting property and insulation performance. As the constituent material of the transparent substrate 2, an inorganic material such as non-alkali glass, quartz glass, or sapphire, or an organic material such as polyethylene (PE), polyethylene terephthalate (PET), polyethylene naphthalate (PEN), polyimide, polyamide, polyamide-imide, or a liquid crystal polymer is used. For example, the transparent substrate 2 may be a rigid substrate formed of an inorganic material or an organic material, or may be a flexible substrate formed of an organic material or a very thin inorganic material.

In the case where the photoelectric conversion device 1 in the embodiment is a solar cell, the photoelectric conversion layer 5 is irradiated with light through the transparent substrate 2 and the transparent electrode 4. In the case where the photoelectric conversion device 1 is a light emitting device, light generated in the photoelectric conversion layer 5 is emitted through the transparent substrate 2 and the transparent electrode 4. In the case where the counter electrode 6 is also formed of a transparent material, light irradiation or light emission is also performed through the counter electrode 6. To take the case where the photoelectric conversion device 1 is a solar cell as an example, charge separation is caused by the light irradiating the photoelectric conversion layer 5, so that electrons and holes are generated. Out of the electrons and the holes generated in the photoelectric conversion layer 5, for example, the electrons are collected in the transparent electrode 4, and the holes are collected in the counter electrode 6. The functions of the transparent electrode 4 and the counter electrode 6 may be reversed. Hereinafter, these parts will be explained.

The transparent electrode 4 is formed of a material having a light transmitting property and conductivity. As the constituent material of the transparent electrode 4, a conductive metal oxide such as indium oxide, zinc oxide, tin oxide, indium tin oxide (ITO), fluorine-doped tin oxide (FTO), gallium-doped zinc oxide (GZO), aluminum-doped zinc oxide (AZO), indium-zinc oxide (IZO), or indium-gallium-zinc oxide (IGZO); a conductive polymer such as poly(3,4-ethylenedioxythiophene)/poly(4-styrenesulfonate) (PEDOT/PSS); or a carbon material such as graphene is used. The constituent material of the transparent electrode 4 may also be a composite material in which a nano conductive material such as a silver nanowire, a gold nanowire, or a carbon nanotube is added to any of the materials described above. Further, the transparent electrode 4 may be a stacked film of a layer formed of any of the above-described materials and a metal layer formed of metal such as gold, platinum, silver, copper, cobalt, nickel, indium, or aluminum, or an alloy containing any of these metals, within a range capable of maintaining the light transmitting property. The method of forming the transparent electrode 4 is not limited in particular, but the transparent electrode 4 is formed by, for example, a vacuum deposition method, a sputtering method, an ion plating method, a CVD method, a sol gel method, a plating method, a coating method, or the like.

The thickness of the transparent electrode 4 is not particularly limited, but is preferably 10 nm or more and 1 µm or less, and further preferably 30 nm or more and 300 nm or less. When the film thickness of the transparent electrode 4 is too thin, sheet resistance becomes high. When the film thickness of the transparent electrode 4 is too thick, light transmittance decreases, and further flexibility decreases, so that a crack or the like is likely to occur due to a stress. It is preferable to select the film thickness of the transparent electrode 4 so that high light transmittance and low sheet resistance are both obtained. The sheet resistance of the transparent electrode is not particularly limited, but is generally $1000\Omega/\square$ or less, preferably $500\Omega/\square$ or less, and more preferably $200\Omega/\square$ or less. In the case of a current driven type device such as a solar cell or a light emitting device, the sheet resistance is further preferably $50\Omega/\square$ or less.

Figure 2:
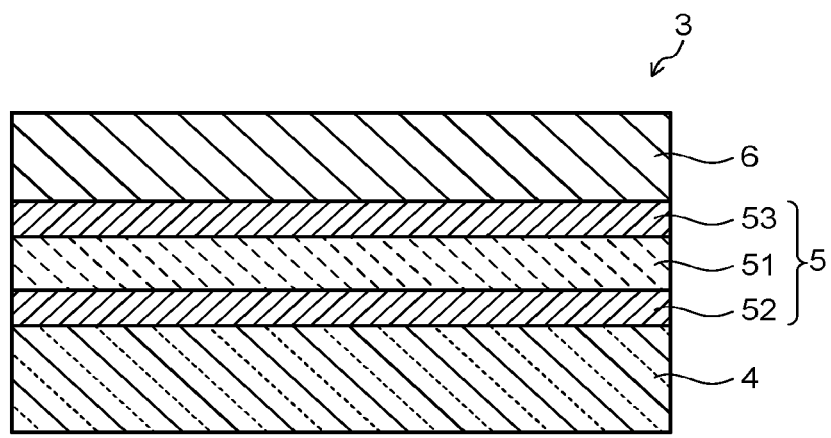
FIG. 2 is a cross-sectional view illustrating a photoelectric conversion part in the photoelectric conversion device illustrated in FIG. 1 in an enlarged manner.

The photoelectric conversion layer 5 has an active layer 51, a first intermediate layer (first buffer layer) 52 disposed between the transparent electrode 4 and the active layer 51, and a second intermediate layer (second buffer layer) 53 disposed between the active layer 51 and the counter electrode 6, as illustrated in FIG. 2, for example. The second intermediate layer 53 may further have a first counter electrode-side intermediate layer and a second counter electrode-side intermediate layer. The first and second intermediate layers 52, 53 are disposed when necessary, and in some cases, both or one of them may be omitted. The layers 51, 52, and 53 composing the photoelectric conversion layer 5 are appropriately selected according to a device (a solar cell, a light emitting device, a photosensor, or the like) to which the photoelectric conversion device 1 is applied. Hereinafter, the case where the photoelectric conversion device 1 is used as a solar cell will be mainly described, but the photoelectric conversion device 1 in the embodiment is applicable also to a light emitting device, a photosensor, and the like.

The active layer 51 contains a perovskite compound. Examples of the perovskite compound used in the active layer 51 include a compound having a composition represented by $ABX_3$. The A site is a monovalent cation, the B site is a divalent cation, and X site is a monovalent halogen anion. As the monovalent cation of the A site, there is cited, for example, at least one selected from a methylammonium ion ($CH_3HN_4^+$), a formamidinium ion ($NH=CHNH_2^+$), a potassium ion ($K^+$), a rubidium ion ($Rb^+$), and a cesium ion ($Cs^+$). As the divalent cation of the B site, there is cited at least one selected from a lead ion ($Pb^{2+}$), a germanium ion ($Ge^{2+}$), and a tin ion ($Sn^{2+}$). As the monovalent halogen anion of the X site, there is cited at least one selected from an iodine ion ($I^-$), a bromide ion ($Br^-$), and a chlorine ion ($Cl^-$). As the method of forming the active layer 51, there are cited a method of subjecting the above-described perovskite compound or its precursor to vacuum deposition or a method in which a solution obtained by dissolving the perovskite compound or its precursor in a solvent is applied and is dried by heating. As the precursor of the perovskite compound, there are cited a mixture of methylammonium halide and lead halide or tin halide, and so on. The thickness of the active layer 51 is not limited in particular, but is preferably 10 nm or more and 1000 nm or less. The active layer 51 may contain an additive, a solvent, or the like other than the perovskite compound.

In the case where, out of the electrons and the holes generated in the photoelectric conversion layer 5, the electrons are collected in the transparent electrode 4, the first intermediate layer 52 is preferably formed of a material capable of selectively and efficiently transporting the electrons. As the constituent material of the first intermediate layer 52 functioning as an electron transport layer, an inorganic material such as zinc oxide, titanium oxide, or gallium oxide, an organic material such as polyethyleneimine or its derivative, and a carbon material such as a fullerene derivative are cited, and the constituent material is not particularly limited. In the case where the holes are collected in the transparent electrode 4, the first intermediate layer 52 is preferably formed of a material capable of selectively and efficiently transporting the holes. As the constituent material of the first intermediate layer 52 functioning as a hole transport layer, an inorganic material such as nickel oxide, copper oxide, vanadium oxide, tantalum oxide, or molybdenum oxide and an organic material such as polythiophene, polypyrrole, polyacetylene, triphenylenediaminepolypyrrol, polyaniline, or a derivative of any of these are cited, and the constituent material is not particularly limited. The thickness of the first intermediate layer 52 is preferably 0.05 nm or more and 200 nm or less, and more preferably 0.1 nm or more 50 nm or less.

In the case where, out of the electrons and the holes generated in the photoelectric conversion layer 5, the holes are collected in the counter electrode 6, the second intermediate layer 53 is preferably formed of a material capable of selectively and efficiently transporting the holes. In the case where the electrons are collected in the counter electrode 6, the second intermediate layer 53 is preferably formed of a material capable of selectively and efficiently transporting the electrons. The constituent materials of the second intermediate layer 53 functioning as the hole transport layer and the second intermediate layer 53 functioning as the electron transport layer are the same as the constituent material of the first intermediate layer 52. The thickness of the second intermediate layer 53 is preferably 0.05 nm or more and 200 nm or less, and more preferably 0.1 nm or more and 50 nm or less.

The counter electrode 6 is formed of a material having conductivity, and in some cases, having a light transmitting property. As the constituent material of the counter electrode 6, metal such as platinum, gold, silver, copper, nickel, cobalt, iron, manganese, tungsten, titanium, zirconium, tin, zinc, aluminum, indium, chromium, lithium, sodium, potassium, rubidium, cesium, calcium, magnesium, barium, samarium, or terbium, an alloy containing any of these, a conductive metal oxide such as indium-zinc oxide (IZO), a carbon material such as graphene or carbon nanotube, or the like is used, for example. The constituent material of the counter electrode 6 may also be a composite material in which a nano conductive material such as a silver nanowire, a gold nanowire, or a carbon nanotube is added to any of the materials described above.

The method of forming the counter electrode 6 is not limited in particular, but the counter electrode 6 is formed by, for example, a vacuum deposition method, a sputtering method, an ion plating method, a sol-gel method, a plating method, a coating method, or the like. The thickness of the counter electrode 6 is not limited, but preferably 1 nm or more and 1 μm or less. When the thickness of the counter electrode 6 is too thin, resistance becomes too high, which may make it impossible to sufficiently transmit the generated electric charges to an external circuit. When the thickness of the counter electrode 6 is too thick, its film formation takes a long time and a material temperature increases, which may damage the active layer 51. Sheet resistance of the counter electrode 6 is not limited in particular, but is preferably 500Ω/□ or less, and more preferably 200Ω/□ or less. In the case of a current driven type device such as a solar cell or a light emitting device, the sheet resistance is further preferably 50Ω/□ or less.

In the photoelectric conversion device 1 in the embodiment, the first photoelectric conversion part 3A and the second photoelectric conversion part 3B that are adjacent to each other are electrically connected by a connection part 7A. The connection part 7A is formed in which a first groove 8A is formed in the photoelectric conversion layer (5) uniformly provided on the transparent electrodes 4A, 4B and a part of the constituent material of the counter electrode 6A of the photoelectric conversion part 3A is filled in the first groove 8A to form an electric conductor 9A. The groove 8A does not need to be such a groove as to separate the first photoelectric conversion layer 5A and the second photoelectric conversion layer 5B, and may also be a through hole to be an electric pathway. The counter electrode 6A of the photoelectric conversion part 3A and the transparent electrode 4B of the photoelectric conversion part 3B are connected in series by the connection part 7A having the groove 8A and the electric conductor 9A filled in the groove 8A. Similarly, the counter electrode 6B of the second photoelectric conversion part 3B and the transparent electrode 4C of the third photoelectric conversion part 3C, the second photoelectric conversion part 3B and the third photoelectric conversion part 3C being adjacent to each other, are electrically connected by a connection part 7B having an electric conductor 9B formed by a part of the constituent material of the counter electrode 6B being filled in a first groove 8B. FIG. 1 illustrates the case where the number of photoelectric conversion parts 3 composing the photoelectric conversion device 1 is three, but the number of photoelectric conversion part 3 is not limited in particular as long as it is plural. Also in the case where the photoelectric conversion device 1 has four or more photoelectric conversion parts 3, the adjacent photoelectric conversion parts 3 are electrically connected by the connection part 7, similarly.

Figure 3:
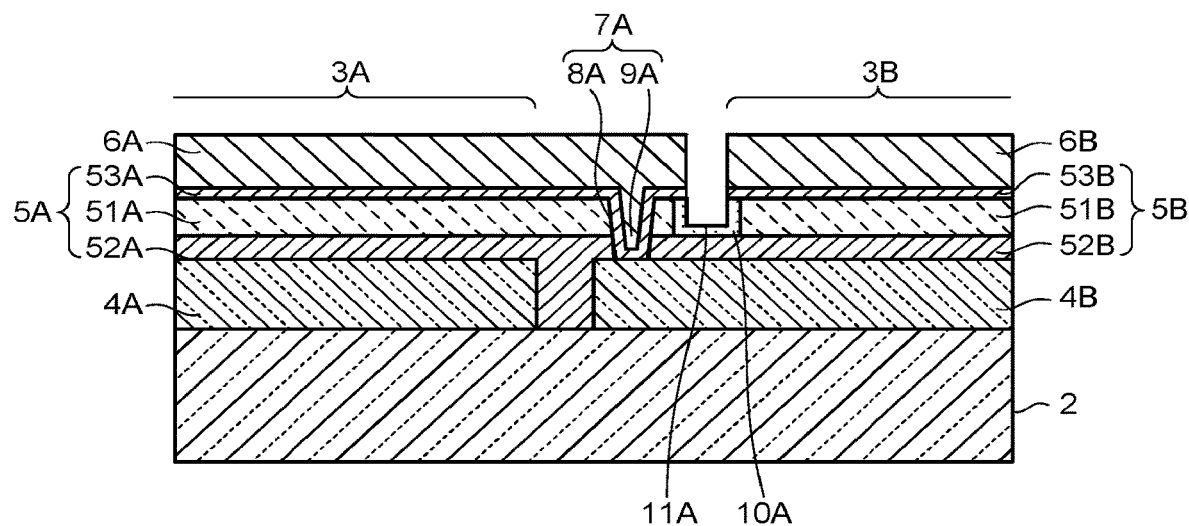
FIG. 3 is a cross-sectional view illustrating one example of a part of the photoelectric conversion device illustrated in FIG. 1 in an enlarged manner.
Figure 4:
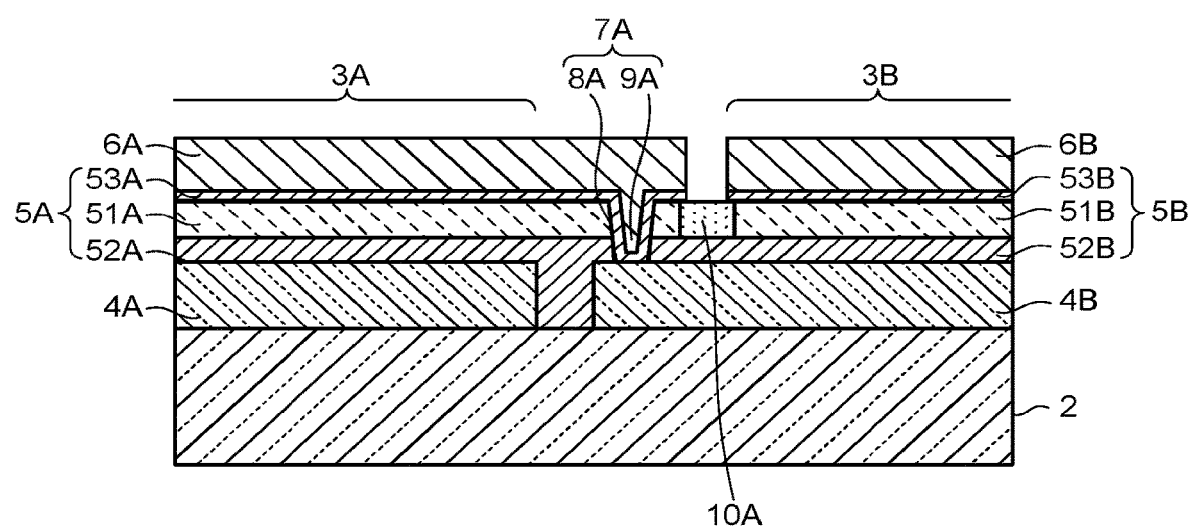
FIG. 4 is a cross-sectional view illustrating another example of a part of the photoelectric conversion device illustrated in FIG. 1 in an enlarged manner.

In the photoelectric conversion device 1 in the embodiment, as illustrated in FIG. 3 and FIG. 4, for example, between the first photoelectric conversion part 3A and the second photoelectric conversion part 3B that are adjacent to each other, adjacent surfaces (vicinal surfaces) of the first photoelectric conversion layer 5A and the second photoelectric conversion layer 5B that are adjacent to each other are electrically separated by an inactive region 10A having electrical resistance higher than that of the first and second photoelectric conversion layers 5A, 5B. The electrical separation between the first photoelectric conversion layer 5A and the second photoelectric conversion layer 5B just indicates the separation between the adjacent surfaces (vicinal surfaces/end surfaces) of the first photoelectric conversion layer 5A and the second photoelectric conversion layer 5B that are adjacent to each other, and the first photoelectric conversion part 3A and the second photoelectric conversion part 3B are electrically connected by the connection part 7A as described above. In other words, the end surface of the first photoelectric conversion layer 5A close to the second photoelectric conversion layer 5B and the end surface of the second photoelectric conversion layer 5B close to the first photoelectric conversion layer 5A are electrically separated by the inactive region 10A. The same is true of the second photoelectric conversion part 3B and the third photoelectric conversion part 3C that are adjacent to each other, and adjacent surfaces (vicinal surfaces) of the second photoelectric conversion layer 5B and the third photoelectric conversion layer 5C that are adjacent to each other are electrically separated by an inactive region 10B.

The inactive regions 10 (10A, 10B) contain a compound of at least a part of a metallic element composing the perovskite compound contained in the active layer 51 and halogen, for example. Examples of such a halide of the metallic element include a compound ($BX_2$) of at least one B site metallic element selected from lead, germanium and tin, and halogen such as $BI_2$, $BBr_2$, or $BCl_2$. The compound of the metallic element and the halogen may be an AX compound such as KX, RbX, or CsX. These halides of the metallic element ($BX_2$ and AX) each have electrical resistance higher than that of the perovskite compound and are a high electrical resistance body and further an insulator, and thus disposing the inactive region 10 containing such a compound between the adjacent surfaces (facing surfaces) of the two adjacent photoelectric conversion layers 5 makes it possible to electrically separate the adjacent surfaces (facing surfaces) of the two adjacent photoelectric conversion layers 5 more securely. When considering the electrical separability between the adjacent surfaces (facing surfaces) of the two photoelectric conversion layers 5, the halide of the metallic element preferably contains a halide of lead such as $PbI_2$. Suppressing a short between the two adjacent photoelectric conversion layers 5 makes it possible to improve the characteristics such as the photoelectric conversion efficiency of the photoelectric conversion device 1.

The above-described inactive regions 10 (10A, 10B) differ in a formation region, a forming form, and the like according to a patterning method of the counter electrodes 6 (6A, 6B, 6C). For example, as illustrated in FIG. 3, in the case where the counter electrode (6) is formed similarly uniformly on the photoelectric conversion layer (5) formed uniformly in a manufacturing process, the counter electrode 6 is scribed together with the photoelectric conversion layer (5) to form a second groove (separation groove) 11 (11A), and is patterned. At this time, the separation groove 11 is formed by scribing, for example, mechanical scribing a stacked film of the counter electrode (6) and the photoelectric conversion layer (5). At this time, the constituent material of the photoelectric conversion layer (5) which contains the perovskite compound, is soft and has viscosity, and thus is likely to remain in the separation groove 11 after being scribed.

With respect to such a point, a residue such as the perovskite compound in the separation groove 11 is exposed to an air atmosphere, a humidified atmosphere, or a predetermined solvent atmosphere, and thereby the perovskite compound represented by $ABX_3$ is altered to $BX_2$ or AX. That is, it is possible to alter the residue such as the perovskite compound to an insulator or a high electrical resistance body having electrical resistance higher than that of the perovskite compound. Accordingly, even when the perovskite compound or the like remains in the separation groove 11, $BX_2$ or AX can be used as the constituent material of the inactive region 10, so that it is possible to increase the electrical separability. Incidentally, even if a portion in which the adjacent counter electrodes 6 are not partially separated remains, mechanical cleavage is also possible by using a volume change or the like caused by the alteration of the perovskite compound. This is effective when the width of the separation groove 11 is reduced.

Further, as illustrated in FIG. 4, in the case where the counter electrodes 6A, 6B, and 6C are pattern-formed by mask deposition, for example, the counter electrodes 6A, 6B, and 6C are formed on the uniform photoelectric conversion layer 5, resulting in that the photoelectric conversion layer 5 is not separated by such a separation groove 11 as illustrated in FIG. 3. At this time, when the distance between particularly the two adjacent counter electrodes 6 is reduced, the not separated photoelectric conversion layer 5 may be a cause for the short. Thus, the perovskite compound represented by $ABX_3$ is preferably altered to $BX_2$, AX, or the like by using a space present between the two adjacent counter electrodes 6. At this time, the perovskite compound is exposed to an air atmosphere, a humidified atmosphere, a predetermined solvent atmosphere, or the like by using the counter electrodes 6A, 6B, and 6C as a mask, and thereby the perovskite compound positioned between the two counter electrodes 6 is selectively altered. Accordingly, it is possible to selectively form the inactive region 10 containing $BX_2$, AX, or the like between the two adjacent photoelectric conversion layers 5.

When altering the perovskite compound to form the inactive region 10 that contains $BX_2$, AX, or the like, a part of the inactive region 10 may be formed of an altered substance of the perovskite compound because an altered substance such as $BX_2$ or AX is a high electrical resistance body or an insulator. At this time, in order to increase the electrical separability by the inactive region 10 between the two adjacent photoelectric conversion layers 5, the inactive region 10 preferably contains 50 vol % or more of the altered substance of the perovskite compound. Further, the inactive region 10 is more preferably formed of the altered substance of the perovskite compound substantially. A formation region of the inactive region 10 containing the altered substance of the perovskite compound is preferably set to a region within 1 μm inward from an end portion of the counter electrode 6. Here, the region within 1 μm inward from the end portion of the counter electrode 6 means that in the photoelectric conversion layer 5 formed directly under the counter electrode 6, the inactive region 10 is formed from a point toward the lower side in the stack direction from the end portion (end surface) of the counter electrode 6 to a position inward by 1 μm in the in-plane direction relative to the end surface of the counter electrode 6. The formation region of the inactive region 10 is more preferably a region within 300 nm inward from the end portion of the counter electrode 6, and further preferably a region within 100 nm. Thereby, it is possible to increase the electrical separability between the adjacent surfaces (facing surfaces) of the two photoelectric conversion layers 5.

As described above, in the photoelectric conversion device 1 in the embodiment, the adjacent surfaces (vicinal surfaces) of the two adjacent photoelectric conversion layers 5 are electrically separated by the inactive region 10 having electrical resistance higher than that of the photoelectric conversion layer 5. Accordingly, the short between the two adjacent photoelectric conversion layers 5 is suppressed, so that it is possible to improve the characteristics such as the photoelectric conversion efficiency of the photoelectric conversion device 1. Further, for forming the inactive region 10, the alteration of the perovskite compound, namely the alteration of the perovskite compound to $BX_2$, AX, or the like being a high electrical resistance body or an insulator is used, and thereby it is possible to electrically separate the two adjacent photoelectric conversion layers 5 more securely in the case where the counter electrode 6 and the photoelectric conversion layer 5 are mechanically separated by the separation groove 11. That is, even when the perovskite compound remains in the separation groove 11, the residue of the perovskite compound can be altered to a high electrical resistance body or an insulator, so that it is possible to electrically separate the two adjacent photoelectric conversion layers 5 more securely. Further, even in the case where the counter electrode 6 is pattern-formed, by using the patterned counter electrode 6 as a mask, the photoelectric conversion layer 5 is selectively altered to form the inactive region 10, and thereby it is possible to electrically separate the two adjacent photoelectric conversion layers 5 more securely. Thereby, it is possible to improve the characteristics such as the photoelectric conversion efficiency of the photoelectric conversion device 1.

Next, there will be explained a manufacturing method of the photoelectric conversion device 1 in the embodiment with reference to FIG. 5A to FIG. 5D. Incidentally, FIG. 5A to FIG. 5D illustrate a connecting step and a separating step between the photoelectric conversion part 3A and the photoelectric conversion part 3B adjacent thereto, but a connecting step between the photoelectric conversion part 3B and the photoelectric conversion part 3C adjacent thereto is performed similarly. Further, the same is true of the case where the photoelectric conversion device 1 has four or more photoelectric conversion parts 3, and by the same steps, the connection between the adjacent photoelectric conversion parts 3 and the electrical separation between the adjacent photoelectric conversion layers 5 are performed. Here, the manufacturing step of the photoelectric conversion device 1 illustrated in FIG. 3 will be described. The manufacturing step of the photoelectric conversion device 1 illustrated in FIG. 3 includes a step of pattern-forming the counter electrode 6 in place of forming the separation groove 11, and the photoelectric conversion device 1 is manufactured so that structures and steps other than that are made the same as the steps illustrated in FIG. 5A to FIG. 5D.

Figure 5A:
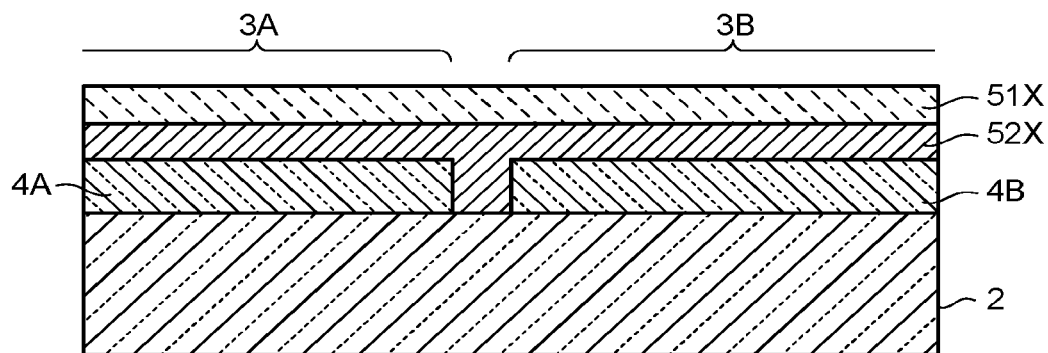
FIG. 5A is a cross-sectional view illustrating one example of a manufacturing step of the photoelectric conversion device in the embodiment.
Figure 5B:
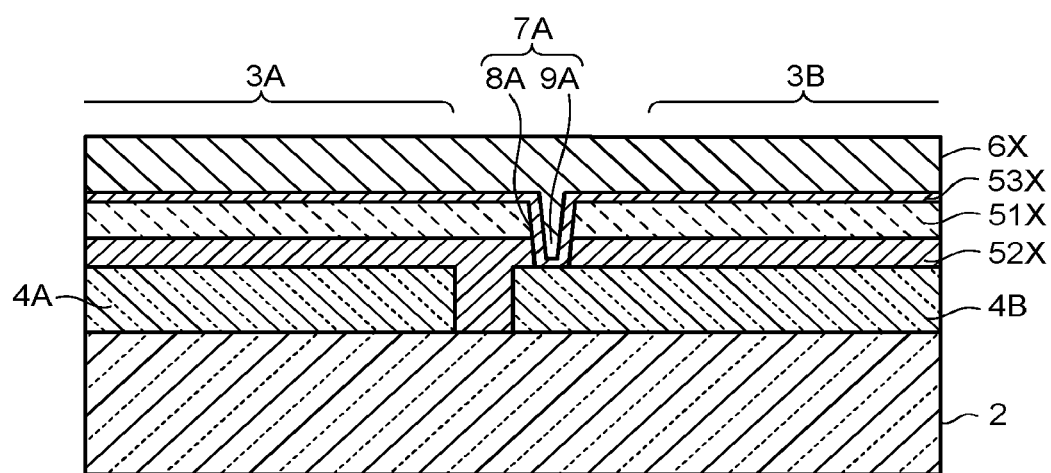
FIG. 5B is a cross-sectional view illustrating one example of the manufacturing step of the photoelectric conversion device in the embodiment.

First, as illustrated in FIG. 5A, on the transparent substrate 2 having the transparent electrode 4A and the transparent electrode 4B, a first intermediate layer 52X and an active layer 51X are formed in order. The first intermediate layer 52X and the active layer 51X are formed on the transparent substrate 2 uniformly (in a sold film state). Then, as illustrated in FIG. 5B, a stacked film of the first intermediate layer 52X and the active layer 51X is scribed along a region on the second transparent electrode 4B adjacent to the first transparent electrode 4A to form the groove 8A, and thereby, the surface of the second transparent electrode 4B is exposed in the groove 8A. The groove 8A is formed by mechanical scribing or laser scribing the stacked film of the first intermediate layer 52X and the active layer 51X. The groove 8A is not limited to a continuous groove shape, and may have such an independent shape as a through hole. Then, on the active layer 51X, a second intermediate layer 53X and a counter electrode 6X are formed in order. The second intermediate layer 53X and the counter electrode 6X are formed uniformly. A part of the second intermediate layer 53X and a part of the counter electrode 6X are filled in the groove 8A, and thereby, the connection part 7A is formed.

Figure 5C:
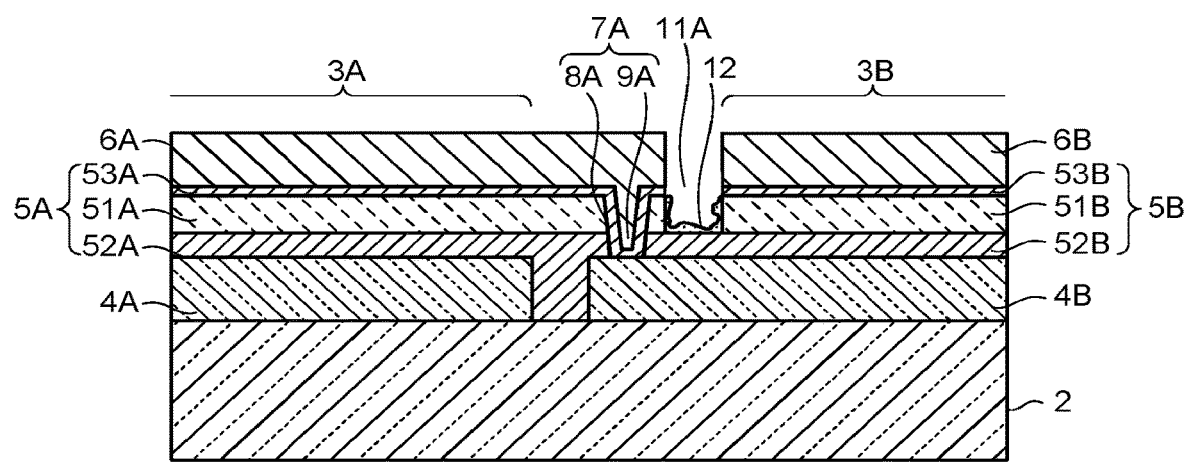
FIG. 5C is a cross-sectional view illustrating one example of the manufacturing step of the photoelectric conversion device in the embodiment.

Then, as illustrated in FIG. 5C, a stacked film of the active layer 51X, the second intermediate layer 53X, and the counter electrode 6X is scribed along a region on the second transparent electrode 4B adjacent to the first transparent electrode 4A to form a second groove 11A. The second groove (separation groove) 11A is formed, to thereby separate the stacked film of the active layer 51X, the second intermediate layer 53X, and the counter electrode 6X, and the active layers 51A, 51B, the first intermediate layers 52A, 52B, and the counter electrodes 6A, 6B corresponding to the photoelectric conversion parts 3A, 3B are formed. The groove 11A is formed by mechanical scribing or laser scribing the stacked film of the active layer 51X, the second intermediate layer 53X, and the counter electrode 6X. The groove 11A may be formed so that cutting off is performed down to the first intermediate layer 52X. However, the separation of the active layer 51X is likely to be insufficient with only the groove 11A, so that the inactive region 10A is formed. That is, in the separation groove 11A, the constituent material of the active layer 51X is likely to remain and a residue 12 made of the perovskite compound being the constituent material of the active layer 51B is likely to be made. The residue 12 of the perovskite compound causes an electrical short between the first active layer 51A and the second active layer 51B.

Figure 5D:
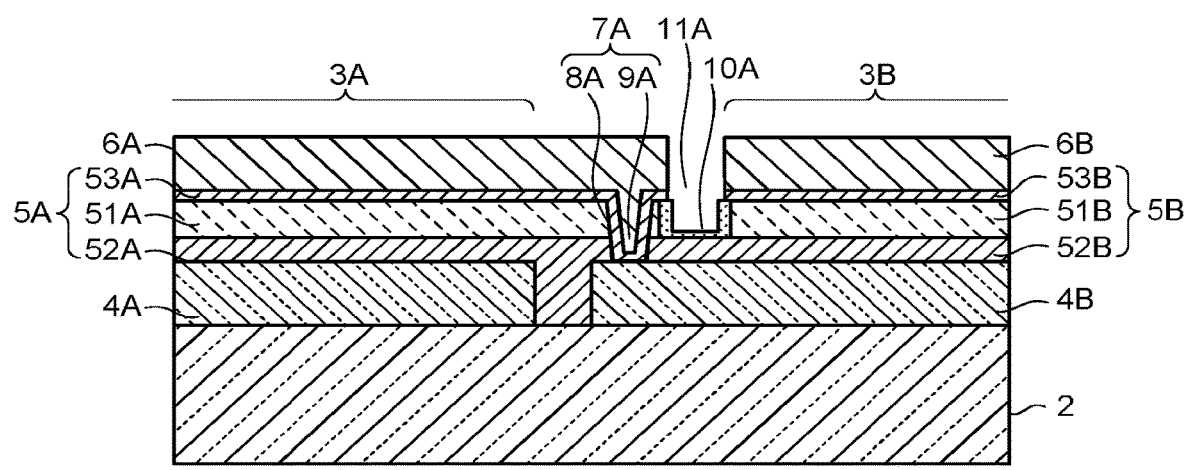
FIG. 5D is a cross-sectional view illustrating one example of the manufacturing step of the photoelectric conversion device in the embodiment.

Thus, as illustrated in FIG. 5D, an device structure in which the separation groove 11A is formed is exposed to an air atmosphere, a humidified atmosphere, a predetermined solvent atmosphere, or the like, to thereby alter the residue 12 of the perovskite compound in the separation groove 11A to $BX_2$, AX, or the like. That is, the residue 12 of the perovskite compound represented by $ABX_3$ is altered to form the inactive region 10 containing a high electrical resistance body or an insulator such as $BX_2$ or AX. Thereby, it is possible to electrically separate the first active layer 51A and the second active layer 51B that are adjacent to each other. As for the step of altering the residue 12 of the perovskite compound, in order to promote the alteration of the residue 12 of the perovskite compound, the device structure in which the separation groove 11A is formed may be heated or the atmosphere to which the device structure is exposed may be increased in temperature. Thereby, it is possible to improve formability of the high electrical resistance body or the insulator such as $BX_2$ or AX. Incidentally, in FIG. 5D, the connection part 7A is illustrated, and thus the second active layer 51B is illustrated so as to be separated, but in practice, the inactive region 10 is formed between the adjacent surfaces of the first active layer 51A and the second active layer 51B that are adjacent to each other to electrically separate them.

EXAMPLE

Next, there will be described examples and their evaluation results.

Example 1

First, on a glass substrate having a thickness of 700 μm, a plurality of ITO films each having a thickness of 150 nm were formed as transparent electrodes. The ITO films were patterned according to a plurality of segments. Then, on the glass substrate having a plurality of the ITO films formed thereon, a nickel oxide layer having a film thickness of about 20 nm was formed as a first intermediate layer. Then, as an active layer, a perovskite layer was formed. As a perovskite material, $CH_3NH_3PbI_3$ was used. As a solvent of a perovskite material ink, a mixed solvent of dimethylformamide (DMF) and dimethyl sulfoxide (DMSO) in a 1:1 ratio was used. After the perovskite material ink was applied on the first intermediate layer, the substrate was immersed in a vessel containing chlorobenzene. Thereafter, the substrate was taken out and heated at 80° C. for 60 minutes, and thereby the perovskite layer was formed. Its film thickness was set to about 250 nm.

Then, as a second intermediate layer, a PC60BM ([6,6]-phenyl C61 butyric acid methyl ester) film having a film thickness of about 50 nm and a BCP (2,9-dimethyl-4,7-diphenyl-1,10-phenanthroline) film having a film thickness of about 20 nm were formed. The PC60BM film was formed by applying a solvent of a PC60BM ink and then letting it dry naturally. The BCP film was formed by vacuum deposition. Then, a stacked film of the first intermediate layer, the perovskite layer, and the second intermediate layer was scribed to form a through hole for a connection part. In this state, as a counter electrode, an about 150 nm-thick film of Ag was formed on the second intermediate layer by vacuum deposition. Ag as the counter electrode was filled in the through hole, so that the counter electrode and the transparent electrode that are adjacent to each other are electrically connected by Ag filled in the through hole.

Then, a stacked film of the first intermediate layer, the perovskite layer, the second intermediate layer, and the counter electrode was mechanical scribed so as to separate adjacent photoelectric conversion parts, to form a separation groove that separates the adjacent photoelectric conversion parts. Conditions of forming the separation groove were set so as to remove at least the perovskite layer. As a result of observation of the inside of the separation groove, it was confirmed that a residue of a perovskite compound is made and the adjacent photoelectric conversion parts are not separated completely. Thereafter, an device structure in which the separation groove was formed was heated while being exposed to a solvent atmosphere of N,N-dimethylformamide (DMF), and thereby $CH_3NH_3PbI_3$ remaining in the separation groove was altered to $PbI_2$ mainly, to thereby form an inactive region that separates adjacent photoelectric conversion layers. When a photoelectric conversion device formed in this manner was observed in a cross-sectional TEM image and each separation state between the photoelectric conversion parts was confirmed, it was confirmed that any adjacent photoelectric conversion parts (photoelectric conversion layers) are sufficiently electrically separated.

Example 2

An device structure having a separation groove was fabricated in the same manner as in Example 1. The device structure was heated at 80° C. for one hour under a saturated steam atmosphere. By this heating, $CH_3NH_3PbI_3$ remaining in the separation groove was altered to $PbI_2$ mainly, to thereby form an inactive region that separates adjacent photoelectric conversion layers. The state of a photoelectric conversion device formed as above was measured in the same manner as in Example 1, and then it was confirmed that any adjacent photoelectric conversion parts (photoelectric conversion layers) are sufficiently electrically separated.

Comparative Example 1

A photoelectric conversion device was fabricated without executing a treatment step in a DMF solvent atmosphere (a step of exposure to a solvent atmosphere) after the separation groove was formed. The state of the photoelectric conversion device formed as above was measured in the same manner as in Example 1, and then it was confirmed that any adjacent photoelectric conversion parts (photoelectric conversion layers) are not sufficiently electrically separated.

While certain embodiments of the present invention have been described, these embodiments have been presented by way of example only, and are not intended to limit the scope of the inventions. Indeed, the novel embodiments described herein may be embodied in a variety of other forms; furthermore, various omissions, substitutions and changes may be made without departing from the spirit of the inventions. The inventions described in the accompanying claims and their equivalents are intended to cover such forms or modifications as would fall within the scope and spirit of the inventions.

What is claimed is:

1. A photoelectric conversion device comprising:
   a transparent substrate;
   a first photoelectric conversion part including a first transparent electrode provided on the transparent substrate, a first photoelectric conversion layer disposed on the first transparent electrode and containing a first perovskite compound, and a first counter electrode disposed on the first photoelectric conversion layer;
   a second photoelectric conversion part including a second transparent electrode provided on the transparent substrate adjacently to the first transparent electrode and separated from the first transparent electrode, a second photoelectric conversion layer disposed on the second transparent electrode adjacently to the first photoelectric conversion layer and containing a second perovskite compound, and a second counter electrode disposed on the second photoelectric conversion layer;
   a connection part electrically connecting the first counter electrode and the second transparent electrode; and
   an inactive region provided between the first photoelectric conversion layer and the second photoelectric conversion layer to electrically separate adjacent portions of the first photoelectric conversion layer and the second photoelectric conversion layer, and the inactive region having electrical resistance higher than electrical resistance of the first and second photoelectric conversion layers, wherein
   each of the first and second perovskite compounds has a composition represented by a general formula:

$ABX_3$, where A is at least one monovalent cation selected from the group consisting of a methylammonium ion, a formamidinium ion, a potassium ion, a rubidium ion, and a cesium ion, B is at least one divalent cation selected from the group consisting of a lead ion, a germanium ion, and a tin ion, and X is at least one monovalent halogen anion selected from the group consisting of an iodine ion, a bromide ion, and a chlorine ion, and the inactive region contains a halide of at least one metal selected from the group consisting of potassium, rubidium, cesium, lead, germanium, and tin which are a constituent metal element of the monovalent cation or the divalent cation.

2. The device according to claim 1, wherein the halide of the metal contains a lead halide.

3. The device according to claim 1, wherein the inactive region contains 50 vol % or more of the halide of the metal.

4. The device according to claim 1, wherein the inactive region is formed in a region within 1 μm inward from an end portion of the second counter electrode.

5. The device according to claim 1, wherein the inactive region contains the halide of the metal formed on at least a wall surface of a groove provided to separate the first photoelectric conversion layer and the second photoelectric conversion layer which are adjacent to each other.

* * * * *